(12) United States Patent
Beck

(10) Patent No.: US 8,832,529 B2
(45) Date of Patent: Sep. 9, 2014

(54) DEVICE AND METHOD FOR TESTING A MEMORY OF AN ELECTRIC TOOL

(75) Inventor: Wolfgang Beck, Schongau (DE)

(73) Assignee: Hilti Aktiengesellschaft, Schaan (LI)

( * ) Notice: Subject to any disclaimer, the term of this patent is extended or adjusted under 35 U.S.C. 154(b) by 94 days.

(21) Appl. No.: 13/550,056

(22) Filed: Jul. 16, 2012

(65) Prior Publication Data

US 2013/0031408 A1   Jan. 31, 2013

(30) Foreign Application Priority Data

Jul. 26, 2011   (DE) .......................... 10 2011 079 780

(51) Int. Cl.
*G11C 29/00* (2006.01)
*G11C 29/08* (2006.01)
*G11C 29/52* (2006.01)
*G11C 29/04* (2006.01)

(52) U.S. Cl.
CPC ........ *G11C 29/08* (2013.01); *G11C 2029/0409* (2013.01); *G11C 2029/0401* (2013.01); *G11C 29/52* (2013.01)
USPC ............................. 714/768; 714/773; 714/733

(58) Field of Classification Search
CPC .......................... G06F 11/2294; G06F 11/2236
USPC ............. 714/768, 773, 733, 718, 25, 27, 6.13
See application file for complete search history.

(56) References Cited

U.S. PATENT DOCUMENTS

| | | |
|---|---|---|
| 4,939,694 A | 7/1990 | Eaton et al. |
| 5,396,619 A | 3/1995 | Walton |
| 5,903,462 A | 5/1999 | Wagner et al. |
| 6,041,363 A * | 3/2000 | Schaffer ........................ 719/321 |
| 2003/0041295 A1 | 2/2003 | Hou et al. |
| 2008/0313452 A1 | 12/2008 | Qin et al. |
| 2011/0161752 A1* | 6/2011 | Spry et al. ..................... 714/718 |

FOREIGN PATENT DOCUMENTS

| | | |
|---|---|---|
| EP | 1 425 665 | 9/2002 |
| WO | WO 2008/018989 | 2/2008 |

* cited by examiner

*Primary Examiner* — Fritz Alphonse
(74) *Attorney, Agent, or Firm* — Davidson, Davidson & Kappel, LLC

(57) ABSTRACT

The device for testing a memory of an electric tool has a control unit, a testing module, a buffer memory and an address translator. The control unit is coupled to the memory and configured to control the electric tool. The testing module is coupled to the memory and configured to test a specific memory cell from among a plurality of memory cells of the memory. The buffer memory is configured to provide temporary storage of the data that is stored in the specific memory cell during the testing of the specific memory cell. The address translator is configured to translate the address of the specific memory cell to the address of the buffer memory during the testing of the specific memory cell. A tool and method are also provided.

15 Claims, 4 Drawing Sheets

DEVICE AND METHOD FOR TESTING A MEMORY OF AN ELECTRIC TOOL

This claims the benefit of German Patent Application DE 10 2011 079 780.7, filed Jul. 26, 2011 and hereby incorporated by reference herein.

The present invention relates to a device and to a method for testing a memory of an electric tool. The memory is, for example, a RAM memory (RAM: Random Access Memory) and the electric tool is, for example, a hand-held power tool, especially an electric hand-held power tool, such as, for instance, an electric screwdriver.

BACKGROUND

Memory tests such as, for example, cyclic RAM tests are required within the scope of various standards for providing functionally reliable software. An example of such a standard is IEC 60730. According to this standard, faulty memory cells have to be detected. After a faulty memory cell has been detected, appropriate safety measures or emergency measures can be initiated.

Within the scope of such RAM tests, various test sequences are written into a RAM cell, read back and checked for correctness. These memory tests are normally performed by the control unit of the electric tool, especially by the software implemented on the control unit. Such a control unit is, for example, a microcontroller or a CPU (CPU: Central Processing Unit).

SUMMARY OF THE INVENTION

Thus, it is a drawback that a certain amount of implementation work is needed for the memory test by the software of the control unit. Moreover, the control unit of the electric tool is occupied while the memory test is being performed and, at least at certain times, can even be blocked. Furthermore, it is a drawback that it might be necessary to block interrupts in order to for the memory test to be performed.

It is an object of the present invention to provide a device for testing a memory of an electric tool that has a control unit, a testing module, a buffer memory and an address translator. The control unit is coupled to the memory and configured to control the electric tool. The testing module is coupled to the memory and configured to test a specific memory cell from among a plurality of memory cells of the memory. The testing module can test the memory cells of the memory one after the other.

The buffer memory is configured to provide temporary storage of the data that is stored in the specific memory cell during the testing of the specific memory cell.

For this purpose, the data that is stored in the specific memory cell is written into the buffer memory by the testing module before the memory test is performed.

The address translator is configured to translate the address of the specific memory cell to the address of the buffer memory during the testing of the specific memory cell.

According to the invention, there is no need for the usual implementation work for the memory test in the software of the control unit. The control unit is alleviated since there is a dedicated testing module. Furthermore, thanks to the dedicated testing module, the operation of the control unit is not blocked at any point in time since, during the testing of a specific memory cell, the control unit in that the data of the specific memory cell since the address translator redirects an access of the control unit to the specific memory cell to the buffer memory that makes the data of the specific memory cell available. The memory is, for example, a RAM memory or a FLASH drive.

The address can especially be referred to as a memory address. The memory especially stores control programs that are needed for purposes of controlling the electric tool and that are accessed by the control unit. Interrupts also remain possible at all times.

The memory cell can have any desired word size, e.g. 1 bit, 4 bit, 8 bit, 16 bit, etc. The control unit can be configured as a microcontroller or as a CPU of the electric tool.

In one embodiment, the memory has one single interface via which the control unit, the testing module and the address translator are coupled to the memory. The interface is, for example, an interface device or a port.

In another embodiment, the address translator is coupled between the interface of the memory and the control unit as well as between the interface of the memory and the testing module.

In another embodiment, a communication bus is provided by means of which the control unit, the testing module and the address translator are coupled. The address translator is coupled to the single interface of the memory.

In another embodiment, the buffer memory is configured as a predefined memory cell of the memory.

For example, the memory has N memory cells, whereby N−1 memory cells can be used for storing data such as, for example, sequential programs, control programs and the like, and whereby the remaining memory cell can serve as a buffer memory.

In another embodiment, the buffer memory is integrated into the address translator.

Owing to the integration of the buffer memory into the address translator, all of the memory cells of the memory can be used to store data. Moreover, since the buffer memory is integrated into the address translator, the address translator does not have to access the memory during the memory test when the control unit is accessing the data of the specific memory cell of the memory, since the address translator already has this data available in the integrated buffer memory.

In another embodiment, the testing module for testing a specific memory cell is configured to store in the buffer memory the data that is stored in the specific memory cell, to write a test sequence into the specific memory cell, to read the test sequence that is stored in the specific memory cell, and to write the data that is stored in the buffer memory back into the specific memory cell.

The testing module can select the test sequence from an array of predefined test sequences.

In another embodiment, the testing module is configured to obtain a test result as a function of the test sequence read out of the specific memory cell, and to transmit the obtained test result to the control unit.

In order to determine the test result, the testing module will especially compare the test sequence read out of the specific memory cell to the test sequence that was written into the specific memory cell.

In another embodiment, the control unit is configured to carry out a safety measure in order to ensure the system safety as a function of the test result transmitted by the testing module.

In another embodiment, if a specific test result is present, the control unit selects a specific safety measure from a plurality of predefined safety measures and subsequently carries them out.

The plurality of predefined safety measures comprises, for example, de-energizing the device, switching the device to be voltage-free, and/or safely shutting down the device.

In another embodiment, the control unit and the testing module are integrated on a single integrated circuit, especially on a chip.

In another embodiment, the testing module and the memory are integrated on a single integrated circuit.

In another embodiment, the control unit, the testing module and the memory are integrated on a single integrated circuit.

In another embodiment, the testing module is configured to cyclically test the memory cells of the memory.

In this manner, automated cyclical memory tests are made possible such as, for example, cyclical RAM tests for microcontroller systems.

Furthermore, an electric tool with a memory is being put forward that has a device for testing a memory of the type described above according to the invention.

The electric tool is, for example, a hand-held power tool or an accumulator for a hand-held power tool. The hand-held power tool is especially an electric hand-held power tool such as, for example, an electric screwdriver.

The electric screwdriver has a housing with a handle by means of which a user can hold and guide the electric screwdriver. A pushbutton on the handle allows the user to put the electric screwdriver into operation. For example, the user has to continuously depress the push-button in order to keep the electric screwdriver in operation.

The electric screwdriver has a tool socket into which the user can insert a screw bit. When the push-button is actuated, an electric motor rotates the tool socket around its axis. The electric motor is coupled to the tool socket via a spindle and optionally via additional components of a drive train such as, for example, a clutch or gears.

Moreover, a method for testing a memory of an electric tool is being put forward which has a control unit coupled to the memory for purposes of controlling the electric tool.

Before a specific memory cell from among a plurality of memory cells of the memory is tested, the data stored in the specific memory cell is stored in a buffer memory. Subsequently, the specific memory cell is tested by means of a testing module that is coupled to the memory. During the testing of the specific memory cell, the address of the specific memory cell is translated to the address of the buffer memory. Consequently, the data stored in the buffer memory can be made available to the control unit at the time of access to the address of the specific memory cell during the memory test.

BRIEF DESCRIPTION OF THE DRAWINGS

The description below explains the invention on the basis of embodiments and figures shown by way of an example. The figures show the following.

Unless otherwise indicated, identical elements or elements having the same function are designated in the figures with the same reference numerals.

DETAILED DESCRIPTION

Figure 1:
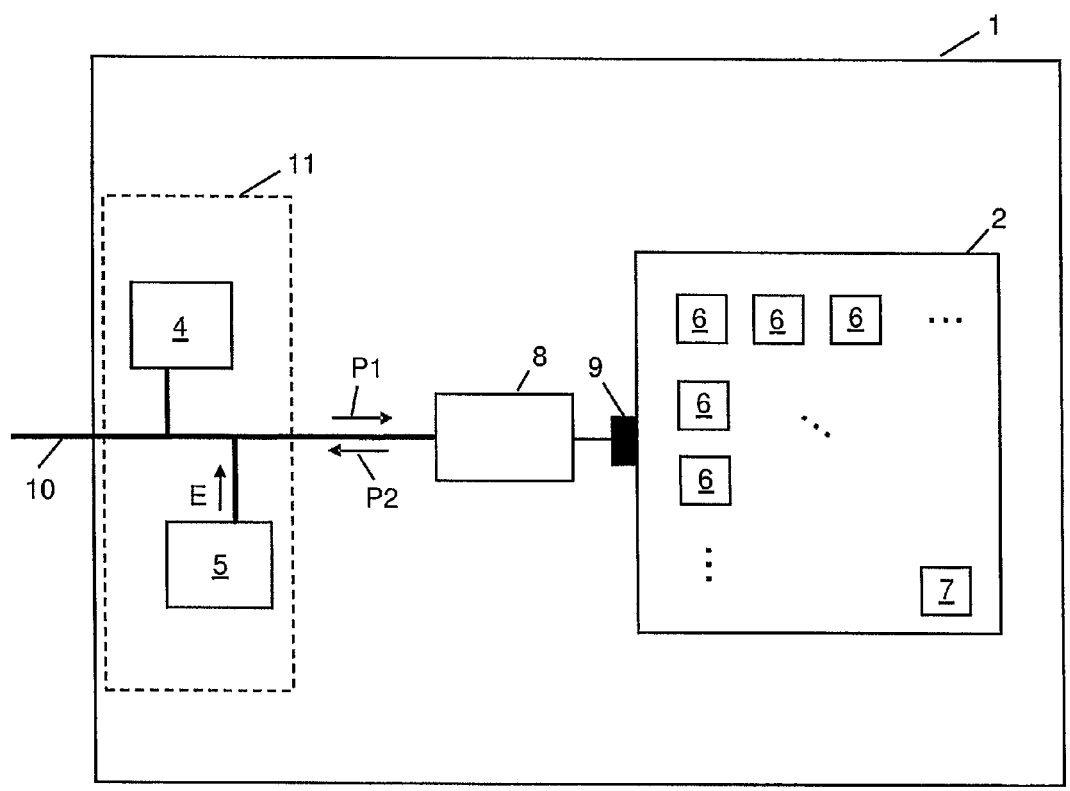
FIG. 1 a schematic block diagram of a first embodiment of a device for testing a memory of an electric tool.
Figure 3:
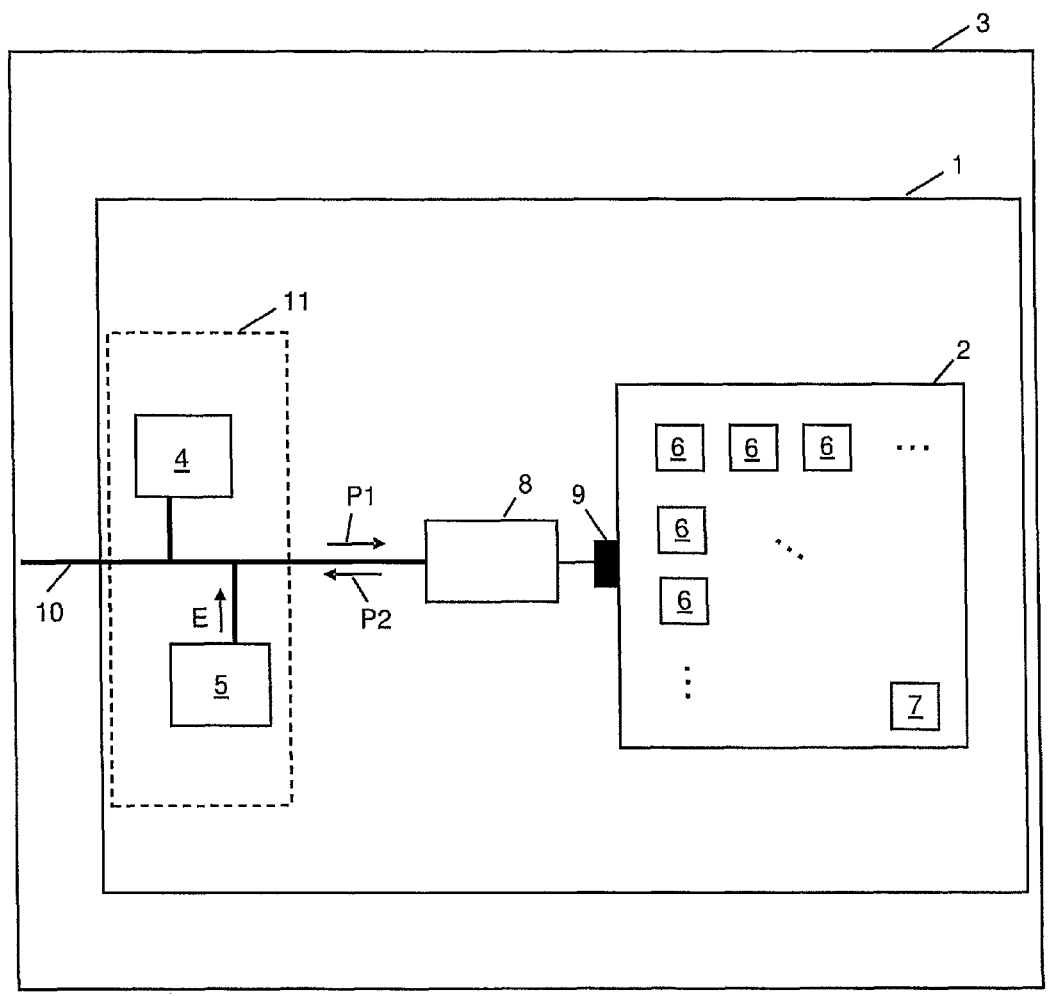
FIG. 3 a schematic block diagram of an embodiment of an electric tool.

FIG. 1 shows a schematic block diameter of a first embodiment of a device 1 for testing the memory 2 of an electric tool 3 (see FIG. 3).

The device 1 has the memory 2, a control unit 4 for purposes of controlling the electric tool 3, and a testing module 5 for testing the memory 2. The memory 2 has a plurality of memory cells 6 for storing data. The memory 2 has another memory cell 7 that serves as a buffer memory. The memory cell 7 can also be referred to as a reserve cell.

Furthermore, the device 1 has an address translator 8 that is coupled to the interface 9 of the memory 2. Moreover, the address translator 8 is coupled to the control unit 4 and to the testing module 5 via a communication bus 10. The control unit 4 and the testing module 5 are preferably integrated on a single integrated circuit 11. The testing module 5 can cyclically test the memory cells 6 of the memory. The particular memory cell 6 that is to be tested is referred to below as the specific memory cell or test cell.

In order to test a specific memory cell 6, the testing module 5 is configured to write into the buffer memory 7 the data that is stored in the specific memory cell 6. Subsequently, the testing module 5 writes a test sequence P1 into the specific memory cell 6 at least once. The test sequence P1 is transmitted via the communication bus 10, the address translator 8 and the interface 9 to the specific memory cell 6 of the memory 2. After a predefined period of time has elapsed, the test sequence P2 stored in the specific memory cell 6 is read out by the testing module 5 via the interface 9, the address translator 8 and the communication bus 10. If the specific memory cell 6 is faulty, the read-out test sequence P2 does not match the written test sequence P1. The original data of the specific memory cell 6 that had been temporarily stored in the buffer memory 7 is written back into the specific memory cell 6. By comparing the written test sequence P1 to the read-out test sequence P2, the testing module 5 can obtain a test result E. As a function of the difference ascertained between the read-out test sequence P2 and the written test sequence P1, the testing module 5 can preferably determine the type and scope of the fault in the specific memory cell 6. The type and scope of the specific fault can be part of the test result E.

The testing module 5 is also configured to transmit the specific test result E to the control unit 4 via the communication bus 10. In particular, the testing module 5 is configured to listen in to the communication bus 10 to ascertain whether the specific memory cell 6 is being read or written by the control unit 4 during an ongoing test. In this case, the testing module 5 makes the data stored in the buffer memory 7 available to the control unit 4.

The control unit 4 is especially configured to carry out a safety measure in order to ensure the system safety as a function of the test result E transmitted by the testing module 5. Especially as a function of the specific type and specific scope of a fault ascertained in the specific memory cell 6, the control unit 4 is configured to select a specific safety measure from a plurality of predefined safety measures and to subsequently carry it out. For example, if a specific fault is ascertained, the device 1 is de-energized. As an alternative, the device 1 can also be safely shut down.

Figure 2:
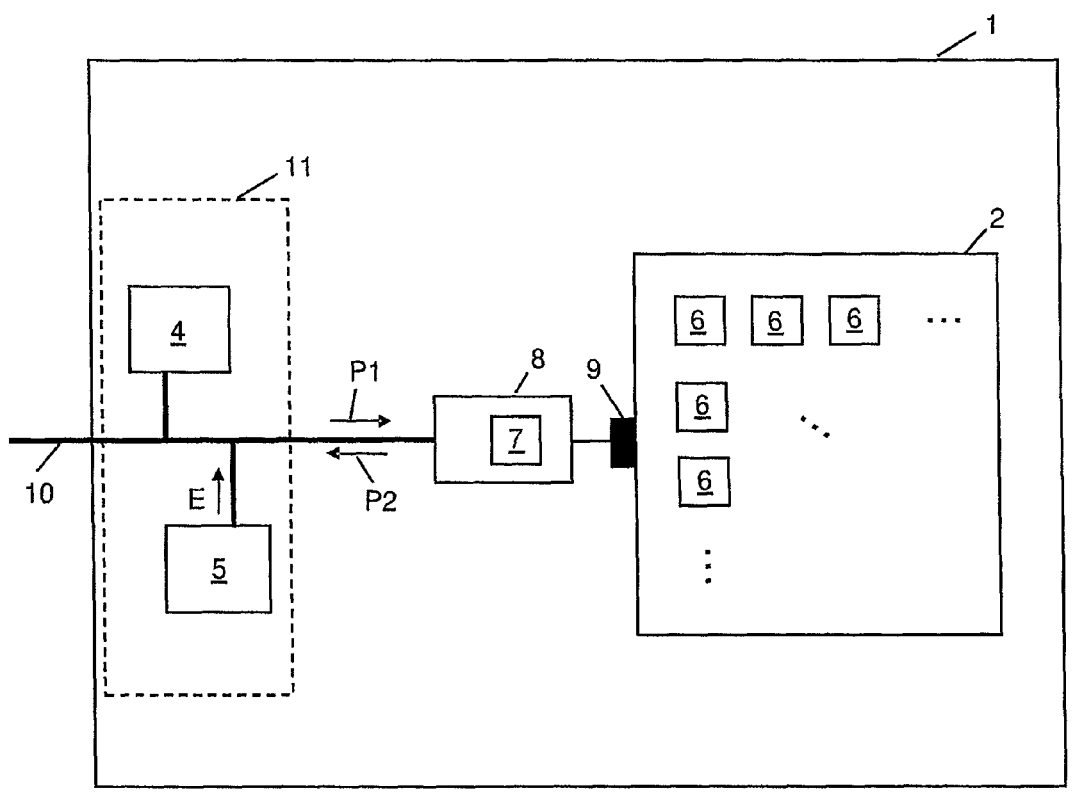
FIG. 2 a schematic block diagram of a second embodiment of a device for testing a memory of an electric tool.

FIG. 2 shows a schematic block diameter of a second embodiment of a device 1 for testing the memory 2 of an electric tool 3. The device 1 of FIG. 2 differs from the device 1 of FIG. 1 in that the buffer memory 7 is not part of the memory 2 but rather part of the address translator 8.

Owing to the integration of the buffer memory 7 into the address translator 8, all of the memory cells 6 of the memory can be used to store data for the control unit 4. Moreover, since the buffer memory 7 is integrated into the address translator 8, when the control unit 4 is accessing the data of the specific memory cell 6 of the memory 2 during the memory test, the address translator 8 does not have to access the memory 2 since the address translator 8 already stores this data in the integrated buffer memory 7. This can save time.

FIG. 3 shows a schematic block diagram of an embodiment of an electric tool 3. The electric tool 3 has the device 1 of FIG. 1. As an alternative, the electric tool 3 can also have the device 1 of FIG. 2. The electric tool 3 is, for example, a hand-held power tool such as an electric screwdriver, a power drill, a hammer drill, or an angle grinder. The electric tool 3 can also be an accumulator for a hand-held power tool.

Figure 4:
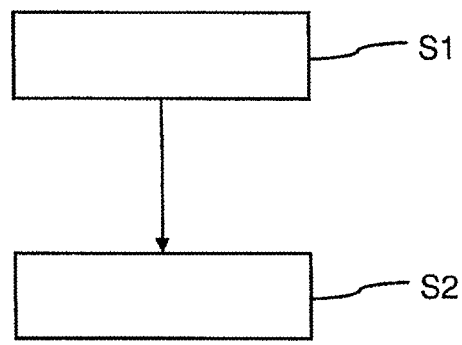
FIG. 4 a schematic flow diagram of a method for testing a memory of an electric tool.

FIG. 4 shows a schematic flow diagram of a method for testing a memory 2 of an electric tool 3. The electric tool 3 has a control unit 4 that is coupled to the memory 2 in order to control the electric tool.

In Step S1, before the testing of a specific memory cell 6 from among a plurality of specific memory cells 6 of the memory 2, the data stored in the specific memory cell 6 is stored in the buffer memory 7.

In Step S2, the specific memory cell 6 is tested by means of a testing module 5 that is coupled to the memory 2. During the testing of the specific memory cell 6, the address of the specific memory cell 6 is translated to the address of the buffer memory 7. Consequently, the data stored in the buffer memory 7 can be made available to the control unit 4 at the time of access to the address of the specific memory cell 6 during the memory test.

What is claimed is:

1. A device for testing a memory of an electric tool, the device comprising:
   a control unit coupled to the memory for controlling the electric tool;
   a testing module coupled to the memory for testing a specific memory cell from among a plurality of memory cells of the memory;
   a buffer memory for providing temporary storage of the data stored in the specific memory cell during the testing of the specific memory cell; and
   an address translator for translating an address of the specific memory cell to an address of the buffer memory during the testing of the specific memory cell.

2. The device as recited in claim 1 wherein the memory has one single interface coupling the control unit, the testing module and the address translator to the memory.

3. The device as recited in claim 2 wherein the address translator is coupled between the interface of the memory and the control unit as well as between the interface of the memory and the testing module.

4. The device as recited in claim 3 further comprising a communication bus coupling the control unit, the testing module and the address translator.

5. The device as recited in claim 1 wherein the buffer memory is configured as a predefined memory cell of the memory.

6. The device as recited in claim 1 wherein the buffer memory is integrated into the address translator.

7. The device as recited in claim 1 wherein the testing module for testing the specific memory cell is configured to store in the buffer memory the data stored in the specific memory cell, to write a test sequence into the specific memory cell, to read the test sequence stored in the specific memory cell, and to write the data stored in the buffer memory back into the specific memory cell.

8. The device as recited in claim 7 wherein the testing module is configured to obtain a test result as a function of the test sequence read out of the specific memory cell, and to transmit the obtained test result to the control unit.

9. The device as recited in claim 8 wherein the testing module is configured to obtain the test result by comparing the test sequence read out of the specific memory cell to the test sequence written into the specific memory cell.

10. The device as recited in claim 8 wherein the control unit is configured to carry out a safety measure in order to ensure the system safety as a function of the test result transmitted by the testing module.

11. The device as recited in claim 10 wherein, if a specific test result is present, the control unit is configured to select a specific safety measure from a plurality of predefined safety measures and to carry out the specific safety measure.

12. The device as recited in claim 1 wherein the control unit and the testing module are integrated on an integrated circuit.

13. An electric tool comprising a device as recited in claim 1.

14. The electric tool as recited in claim 13 wherein the electric tool is a hand-held power tool or an accumulator for a hand-held power tool.

15. A method for testing a memory of an electric tool having a control unit coupled to the memory for controlling the electric tool, the method comprising:
    testing a specific memory cell from among a plurality of memory cells of the memory via a testing module coupled to the memory;
    temporarily storing in a buffer memory data stored in the specific memory cell during the testing of the specific memory cell; and
    translating the address of the specific memory cell to the address of the buffer memory during the testing of the specific memory cell.

* * * * *